United States Patent [19]

Andoh

[11] Patent Number: 5,652,451
[45] Date of Patent: Jul. 29, 1997

[54] RECESSED GATE FIELD EFFECT TRANSISTOR

[75] Inventor: Naoto Andoh, Itami, Japan

[73] Assignee: Mitsubishi Denki Kabushiki Kaisha, Tokyo, Japan

[21] Appl. No.: 522,935

[22] Filed: Sep. 1, 1995

[30] Foreign Application Priority Data

Sep. 5, 1994 [JP] Japan .................................... 6-211053

[51] Int. Cl.$^6$ ............................................ H01L 29/812
[52] U.S. Cl. ........................... 257/330; 257/335; 257/401
[58] Field of Search ........................... 257/784, 773, 257/244, 249, 250, 283, 317, 316, 318, 326, 330-332, 335, 401-403

[56] References Cited

U.S. PATENT DOCUMENTS

| 5,016,067 | 5/1991 | Mori | 257/330 |
|---|---|---|---|
| 5,134,448 | 7/1992 | Johnson et al. | 257/330 |
| 5,312,782 | 5/1994 | Miyazawa | 257/333 |
| 5,510,630 | 4/1996 | Agarwal et al. | 257/402 |

FOREIGN PATENT DOCUMENTS

| 2441432 | 3/1975 | Germany | 257/333 |
|---|---|---|---|
| 56-76571 | 6/1981 | Japan | 257/330 |
| 57-111067 | 7/1982 | Japan | 257/315 |
| 57-193070 | 11/1982 | Japan | 257/283 |
| 58-184767 | 10/1983 | Japan | 257/332 |
| 62-151769 | 9/1987 | Japan . | |
| 63-60566 | 3/1988 | Japan | 257/332 |
| 3242941 | 10/1991 | Japan . | |
| 6-53253 | 2/1994 | Japan | 257/403 |

Primary Examiner—Sara W. Crane
Assistant Examiner—Alexander Oscar Williams
Attorney, Agent, or Firm—Leydig, Voit & Mayer

[57] ABSTRACT

A semiconductor device includes a semiconductor substrate; an active layer having a first surface and a second surface opposing each other and located on the first surface of the semiconductor substrate with the second surface of the active layer contacting the first surface of the semiconductor substrate; a recess structure at the first surface of the active layer and having a bottom within the active layer; a gate electrode on the bottom of the recess structure; a second surface drain electrode disposed on the second surface of the active layer adjacent the recess structure; and a source electrode disposed on the opposite side of the recess structure from the second. Consequently, even if the distance between the edge of the surface drain electrode gate electrode and the corner of the recess structure is reduced, a high gate-drain breakdown voltage can be realized.

9 Claims, 9 Drawing Sheets

Fig.8 (a) Prior Art
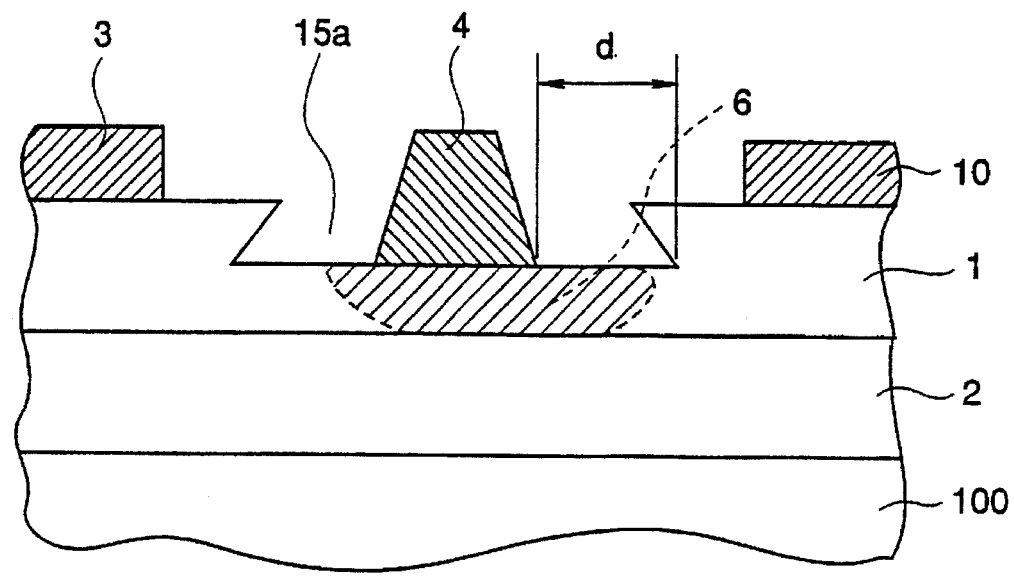
Fig.8 (b) Prior Art
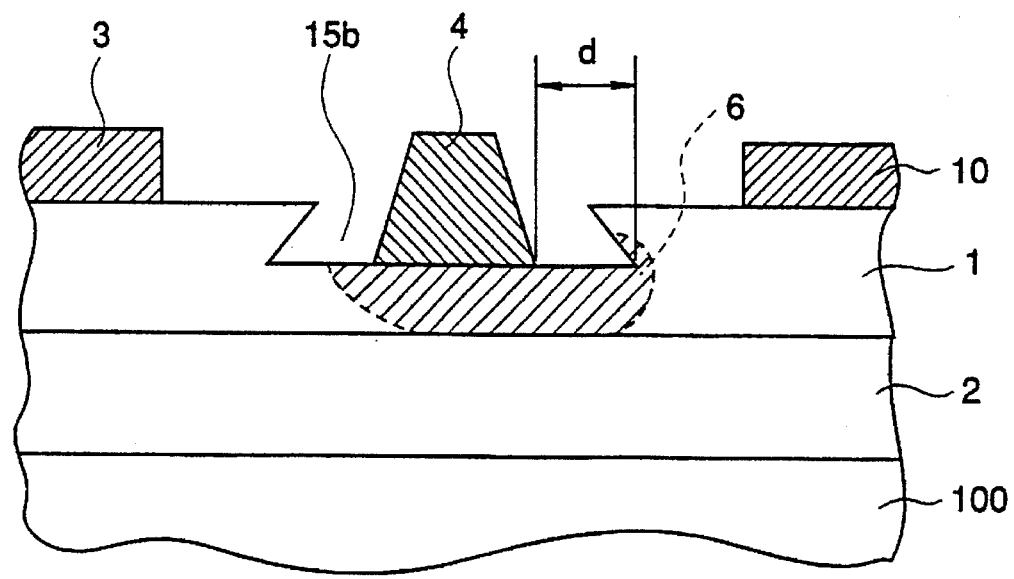

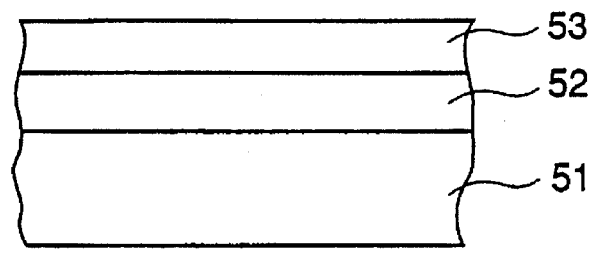
Fig.11 (a) Prior Art
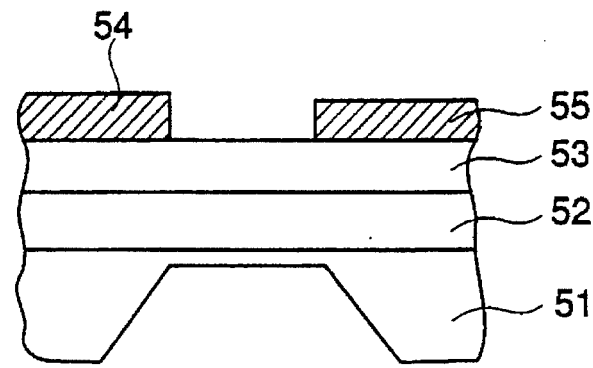
Fig.11 (b) Prior Art
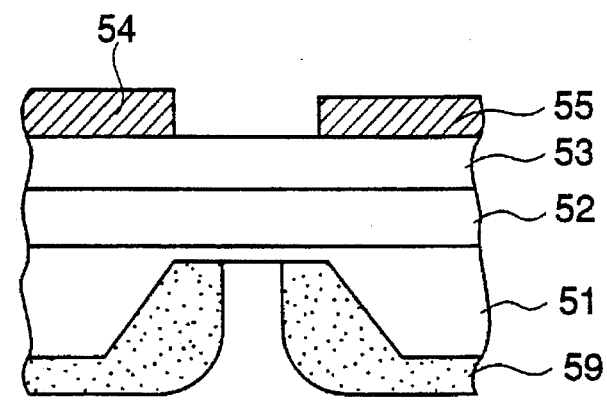
Fig.11 (c) Prior Art
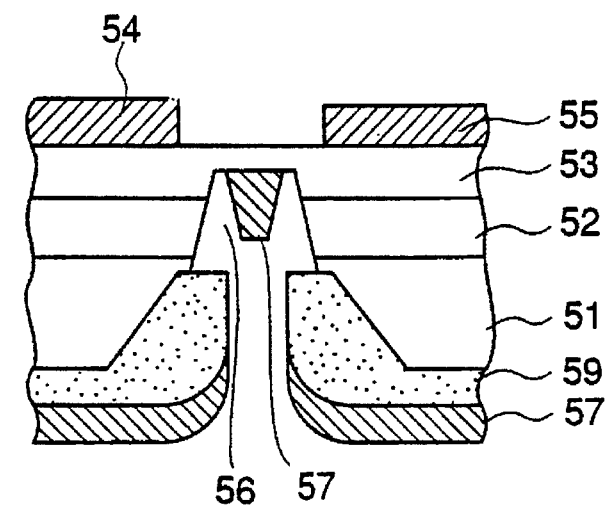
Fig.11 (d) Prior Art

RECESSED GATE FIELD EFFECT TRANSISTOR

FIELD OF THE INVENTION

The present invention relates to a semiconductor device and more particularly, to a field effect transistor having a recess structure.

BACKGROUND OF THE INVENTION

FIGS. 8(a) and 8(b) are cross-sectional views illustrating a field effect transistor (referred to as FET hereinafter) having a recess structure as an example of a conventional semiconductor device. In the figures, reference numeral 100 designates a GaAs semiconductor substrate having a surface, reference numeral 2 designates a GaAs buffer layer disposed on the surface of the GaAs semiconductor substrate 100, reference numeral 1 designates an n type GaAs active layer disposed on the surface of the buffer layer 2, reference numerals 15a and 15b designate recess structures, and reference numeral 4 designates a gate electrode comprising materials such as Al, of a width of 0.25 to 0.5 μm, and disposed on the center of floors of the recess structures 15a and 15b. The distance from the edge of the gate electrode 4 to the corner of the recess structure 15a is about 0.5 μm and the distance from the edge of the gate electrode 4 to the corner of the recess structure 15b is about 0.2 μm. Reference numerals 3 and 10 designate a source electrode and a drain electrode, respectively, both comprising AuGe and related materials and disposed on both sides of the recess structures 15a and 15b. The distance between the source electrode 3 and the drain electrode 10 is 2.5 to 4 μm. Reference numeral 6 designates a depletion region generated under the gate electrode 4.

FIGS. 9(a) to 9(d) are cross-sectional process views illustrating a fabricating method of a conventional FET, where the same reference numerals used in FIGS. 8(a) and 8(b) are to designate the same or corresponding parts. Reference numeral 18 designates a resist, and reference numeral 4a designates a layer comprising the gate electrode material.

The fabricating method will be described as follows. First, as shown in FIG. 9(a), the active layer 1 and the buffer layer 2 are successively grown on the surface of the semiconductor substrate 100 using an epitaxial growth method. Then, as shown in FIG. 9(b), the source electrode 3 and the drain electrode 10 are formed on the surface of the active layer using evaporation and lift-off method.

Next, the resist 18 having an opening between the source electrode 3 and the drain electrode 10 is formed covering the surfaces of the source electrode 3 and the drain electrode 10. Using this resist 18 as a mask, as shown in FIG. 9(d), the active layer 1 is etched to produce the recess structure 15a and furthermore, using the resist 18 as a mask, the gate electrode 4 is formed preferably by evaporation. Simultaneously with the production of the gate electrode 4, the layer 4a comprising the gate electrode material is also deposited on the resist 18.

Finally, the layer 4a comprising the gate electrode material on the resist 18 is removed together with the resist 18 to produce the FET shown in FIG. 8(a).

The operation of the FET will be described as follows. As can be seen in FIG. 8(a), the FET having the recess structure on the active layer 1 has the depletion region 6 under the gate electrode 4. This depletion region 6, when a negative voltage is applied to the gate electrode 4, grows horizontally mainly toward the drain electrode 10 as long as the depletion region 6 exists in the close proximity of the bottom of the recess structure 15a. The larger the ratio of this depletion region 6 to the path which describes the shortest distance connecting the gate electrode 4 and the drain electrode 10 within the active layer, the higher the gate-drain breakdown voltage becomes.

The conventional FET is constructed as described above. However, if the edge of the gate electrode 4 and the corner of the recess structure 15a are widely separated as shown in FIG. 8(a), the time for the FET to reach a stationary state after a voltage is applied becomes longer and characteristics such as a pulse response characteristic is thus degraded. For this reason, there are cases in which the distance between the edge of the gate electrode 4 and the corner of the recess structure 15b is shortened to improve the FET characteristics.

However, if the width of the recess structure 15b of the FET is reduced, as a negative voltage applied to the gate electrode 4 is increased, the depletion region 6 starts to grow out of proximity of the bottom of the recess structure 15b. It extends to an upper portion of the active layer 1 on which the drain electrode 10 is located, i.e., it extends upward along the wall of the recess structure 15b as shown in FIG. 8(b). Therefore, the ratio of the depletion region 6 to the path describing the shortest distance connecting the gate electrode 4 and the drain electrode 10 within the active layer 1 does not increase in accordance with an increase in the gate voltage, thereby decreasing the gate-drain breakdown voltage of the FET.

The structure of an FET designed to solve the above mentioned problem is shown in Japanese Published Utility Model Application No. Sho. 62-151769. FIG. 10 is a cross-sectional view illustrating a structure of another prior art FET which is similar to that of the FET shown in Japanese Published Utility Model Application No. Sho. 62-151769. In the figure, reference numeral 51 designates a semiconductor substrate, reference numeral 52 designates a buffer layer, reference numeral 53 designates an active layer, reference numeral 54 designates a source electrode, reference numeral 55 designates a drain electrode, reference numeral 56 designates a recess structure, reference numeral 57 designates a gate electrode, and reference numeral 58 designates a depletion region.

Furthermore, FIGS. 11(a) to 11(d) are cross-sectional views illustrating the fabricating method of the prior art FET, where the same reference numerals used in FIG. 10 designate the same or corresponding parts. Reference numeral 59 designates a resist.

The fabricating method of this prior art FET will be described as follows. First, as shown in FIG. 11(a), the buffer layer 52 and the active layer 53 are epitaxially grown in this order on the substrate 51, preferably by CVD. Next, a portion of the rear surface of the substrate 51 is etched to the proximity of the buffer layer 52 in a first etching step. Next, the source electrode 54 and the drain electrode 55 are formed on the active layer 53 by evaporation, a space separating these two electrodes corresponding to the portion of the substrate 51 which was etched away (FIG. 11(b)). Next, the resist 59 is deposited on the rear surface of the substrate 51 and a portion of the resist 59 where the gate electrode 57 is to be located is exposed to light only over a prescribed width and it is developed. Then, using this resist 59 as a mask, the rear surface of the substrate 51 is etched until the etching front reaches the active layer 53 in a second etching step using a phosphoric acid based etchant to produce the recess structure 56. Then, using the resist 59 as a mask, the gate electrode 57 is formed by evaporation of Al, and the resist 59 is removed together with the unnecessary Al layer 57 to produce the FET.

The operation of the FET will be described as follows. As shown in FIG. 10, this prior art FET has the depletion region 58 in the active layer 53 in contact with the gate electrode 57. This depletion region 58, when a negative voltage is applied to the gate electrode 57, grows horizontally mainly toward the drain electrode 55. However, in this FET, the drain electrode 55 is located on the surface of the active layer 53 opposite to the side having the recess structure 56. Therefore, even if the depletion region 58 grows out of the proximity of the bottom of the recess structure 56, it does not grow along the wall of the recess structure 56 like the conventional FET illustrated in FIG. 8(b), but it grows toward the surface of the active layer 53 on which the drain electrode 55 is located. Therefore, the ratio of the depletion region 58 to the path which describes the shortest distance connecting the gate electrode 57 and the drain electrode 55 within the active layer 53 increases in response to the voltage applied to the gate electrode 57. Even if the distance d between the corner of the recess structure 56 and the edge of the gate electrode 57 is quite small, i.e., about 0.2 µm, the gate-drain breakdown voltage does not decrease.

As described above, in the prior art FET, the distance between the corner of the recess structure 56 and the edge of the gate electrode 57 is shortened and the gate-drain breakdown voltage does not decrease. However, since the recess structure 56 and the gate electrode 57 are located on the rear surface of the active layer 53, that is, on the side of the rear semiconductor substrate 51, in order to produce this structure, it is necessary to, after removing the portion of the semiconductor substrate 51 where the recess structure 56 is to be formed, deposit the resist 59 on the rear surface of the semiconductor substrate 51 and open an aperture for forming the recess structure 56 by an exposure to light followed by development of the resist 59 at a location corresponding to the recess formed by the first etching step. This opening is also used as a masking pattern when forming the gate electrode 57. However, since the width of the gate electrode is usually quite fine, i.e., 0.25 to 0.5 µm, it is also necessary to make the width of the opening quite fine. Since the thickness of the semiconductor substrate 51 is usually several hundreds of microns, the depth of the recess formed on the semiconductor substrate 51 by the first etching step also becomes several hundreds of microns. If the resist 59 is deposited on a recess of such a depth, the resist 59 fills the recess and the thickness of the resist 59 in this recess becomes large. It is extremely difficult to perform a high precision exposure on a resist of such a large thickness, and the opening for forming the recess structure has poor precision. If this resist 59 is used to form the gate electrode 57, the gate length of the gate electrode 57 has poor precision and the position where the gate electrode is placed also has of poor precision. Since, in a transistor, the gate length is an important factor for determining transistor characteristics, in the prior art FET the desired transistor characteristics are not obtained and FETs of uniform characteristics are not obtained.

Furthermore, for the prior art FET, since the recess structure 56 is formed on the rear surface of the active layer 53, it is necessary to etch the active layer in the second etching step to produce the recess structure 56 after etching the portion of the semiconductor substrate 51 and the buffer layer 52. Therefore, the etching depth is large compared to the case where the active layer 53 alone is etched, so that this makes the etching precision poor and the desired recess width is not obtained. In a transistor, the recess width is also an important factor determining transistor characteristics and high precision is required. However, in the prior art FET, since the etching has poor precision and the desired recess width is not obtained, the desired transistor characteristics cannot be obtained and FETs of uniform characteristics cannot be obtained with great repeatability.

SUMMARY OF THE INVENTION

It is an object of the present invention to provide a semiconductor device having a high gate-drain breakdown voltage even when the distance between the edge of a gate electrode and the corner of a recess structure is shortened and desired characteristics with great repeatability.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a semiconductor substrate having a first surface and a second surface opposing to each other; an active layer having a first surface and a second surface opposing to each other and disposed on the first surface of the semiconductor substrate with the second surface of the active layer contacting the first surface of the substrate; a recess structure formed on the first surface of the active layer and having a bottom within the active layer; a gate electrode disposed on the bottom of the recess structure; a second surface drain electrode, not requiring high precision and therefore easy to fabricate, disposed on the second surface of the active layer in an adjacent region of the recess structure; and a source electrode disposed in a region of the first surface of the active layer opposing to the second surface drain electrode about the recess structure. Therefore, even if the distance between the edge of the gate electrode and the corner of the recess structure is reduced, a high gate-drain breakdown voltage can be realized, and a semiconductor device displaying desired characteristics with great repeatability can be provided.

According to a second aspect of the present invention, in the semiconductor device described as in the first aspect of the present invention, the second surface drain electrode is connected to other circuit elements on the second surface of the semiconductor substrate. Therefore, the connection between the second surface drain electrode and the other circuit elements formed on the second surface of the semiconductor substrate can be easily performed.

According to a third aspect of the present invention, the semiconductor device described as in the first aspect of the present invention further includes a contact electrode penetrating the active layer; and the second surface drain electrode being connected to the contact electrode. Therefore, the electrical connection with the second surface drain electrode can be made from the first surface of the active layer via the contact electrode, and the connection of the FET to the other circuit elements disposed on the first surface of the semiconductor substrate can be easily performed.

According to a fourth aspect of the present invention, the semiconductor device described as in the first aspect of the present invention further includes a contact layer of low resistance disposed within the active layer; a first surface drain electrode disposed on the first surface of the active layer; the second surface drain electrode being connected to the first surface drain electrode via the contact layer; and an insulating region provided between the recess structure and the contact layer in the active layer such that both the contact layer and the first surface drain electrode are not directly and electrically connected to a region of the active layer in the vicinity of the recess structure while the region of the active layer in the vicinity of the recess structure is electrically connected to the second surface drain electrode. Therefore, the connection of the FET to the other circuit elements disposed on the first surface of the semiconductor substrate can be easily performed. In addition, the first surface drain electrode for taking out the second surface drain electrode from the first surface can be positioned close to the recess structure due to the insulating region, the area of the semiconductor device can be reduced.

According to a fifth aspect of the present invention, a semiconductor device comprises a semiconductor substrate having a first surface and a second surface opposing to each other; an active layer having a first surface and a second surface opposing to each other and disposed on the first surface of the semiconductor substrate with the second surface of the active layer contacting the first surface of the semiconductor substrate; a recess structure formed on the first surface of the active layer and having a bottom within the active layer; a gate electrode formed on the bottom of the recess structure; a drain electrode disposed on the first surface of the active layer such that the drain electrode is not directly and electrically connected to a region of the active layer in the vicinity of the recess structure; a contact layer of low resistance disposed in a region of the active layer adjacent to the recess structure and electrically connected to the drain electrode such that a depletion region generated in a region of the active layer in contact with the gate electrode is attracted to the second surface side of the active layer; and a source electrode disposed in a region of the first surface of the active layer opposing to the drain electrode about the recess structure. Therefore, the processes of producing a gate electrode or a second surface drain electrode on the second surface of the active layer can be eliminated, and even when the distance between the edge of the gate electrode and the corner of the recess structure is reduced, a high gate-drain breakdown voltage can be realized, and the semiconductor device displaying desired characteristics with great repeatability can be easily provided.

According to a sixth aspect of the present invention, the semiconductor device described as in the fifth aspect of the present invention further includes the contact layer extending from the first surface to the second surface of the active layer; and an insulating region disposed between the contact layer and the region of the active layer in the vicinity of the recess structure and extending from the first surface of the active layer but not reaching the second surface of the active layer. Therefore, even if the distance between the edge of the gate electrode and the corner of the recess structure is reduced, a high gate-drain breakdown voltage can be realized and a semiconductor device displaying desired characteristics with great repeatability can be easily provided.

According to a seventh aspect of the present invention, the semiconductor device described as in the fifth aspect of the present invention further includes a barrier layer having a conductivity type opposite to the conductivity type of the active layer disposed in the active layer at the prescribed depth; a recess formed on the first surface of the active layer and having a bottom deeper than the barrier layer, the recess being in contact with the contact layer on the side opposite to the recess structure side; the contact layer extending from the first surface to the second surface of the active layer; and the drain electrode disposed on the inner surface of the recess without contacting the contact layer. Therefore, even if the distance between the edge of the gate electrode and the corner of the recess structure is reduced, a high gate-drain breakdown voltage can be realized and a semiconductor device displaying desired characteristics with great repeatability can be easily provided.

BRIEF DESCRIPTION OF THE DRAWINGS

FIGS. 8(a) and 8(b) are cross-sectional views illustrating an FET according to the prior art.

FIGS. 11(a) to 11(d) are cross-sectional process views illustrating a method of fabricating the prior art FET shown in FIG. 10.

DETAILED DESCRIPTION OF THE PREFERRED EMBODIMENTS

[EMBODIMENT 1]

Figure 1:
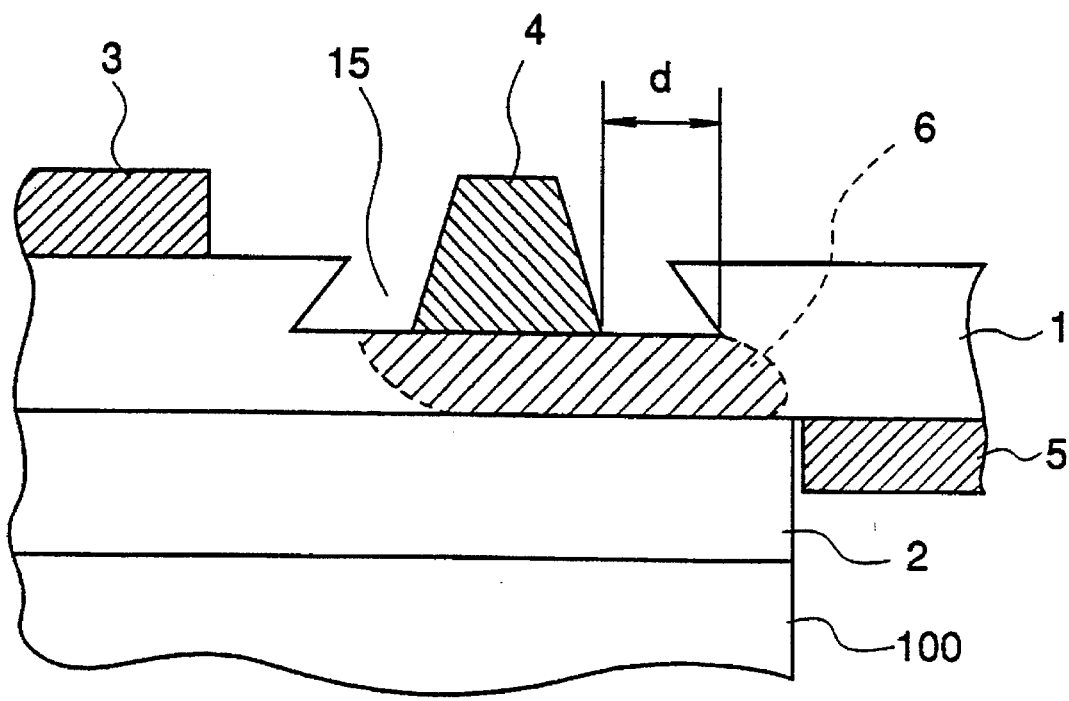
FIG. 1 is a cross-sectional view illustrating an FET according to a first embodiment of the present invention.

FIG. 1 is a cross-sectional view illustrating the structure of an FET according to a first embodiment of the present invention. In the figure, reference numeral 100 designates a GaAs semiconductor substrate having a surface, reference numeral 2 designates a GaAs buffer layer on the surface of the GaAs semiconductor substrate 100. Reference numeral 1 designates a GaAs active layer of a thickness of 1500 to 3000 Å, containing an n type dopant such as Si, Al, and In, and disposed on the surface of the buffer layer 2. Reference numeral 15 designates a recess structure of a depth of 1000 to 2000 Å. Reference numeral 4 designates a gate electrode of a width of 0.25 to 0.5 μm, comprising a material such as Al, and placed at the center of the bottom of the recess structure 15. The distance d between the corner of the recess structure 15 and the edge of the gate electrode 4 is about 0.5 μm. Reference numeral 3 designates a source electrode comprising AuGe and related materials and disposed on one of the sides of the recess structure on the surface of the active layer 1. Reference numeral 5 designates a drain electrode comprising AuGe and related materials and disposed on the rear surface of the active layer 1 on the other of the sides of the recess structure 15. The distance between the source electrode 3 and the drain electrode 5 in the recess width direction is 2.5 to 4 µm. Reference numeral 6 designates a depletion region generated under the gate electrode 4.

FIGS. 2(a) to 2(f) are cross-sectional views illustrating the fabricating method of the FET in accordance with the first embodiment of the present invention. In the figure, the same reference numerals used in FIG. 1 are to designate the same or corresponding parts. Reference numerals 16 and 17 designate first and second resists, respectively, and reference numeral 4a designates a layer comprising the gate electrode material.

Figure 2:
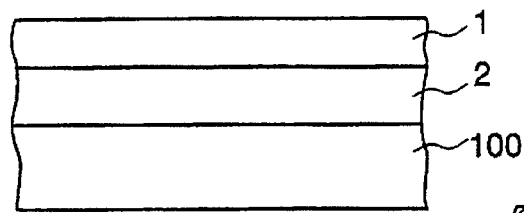
FIGS. 2(a) to 2(f) are cross-sectional process views illustrating a method of fabricating the FET according to the first embodiment of the present invention.
Figure 2:
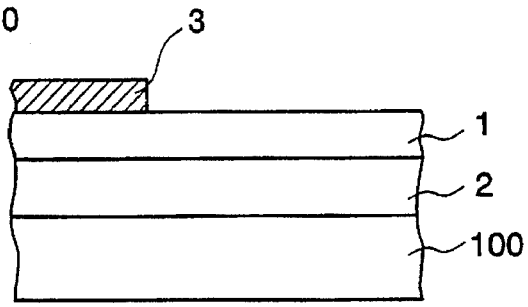
Figure 2:
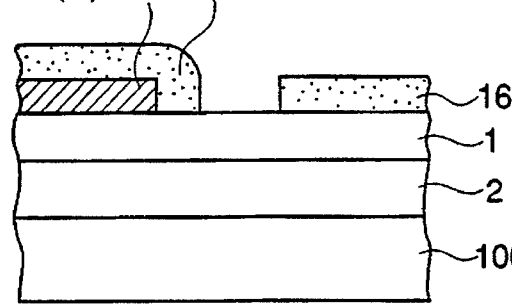
Figure 2:
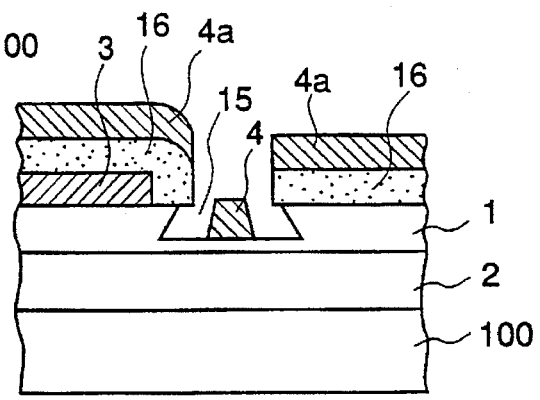
Figure 2:
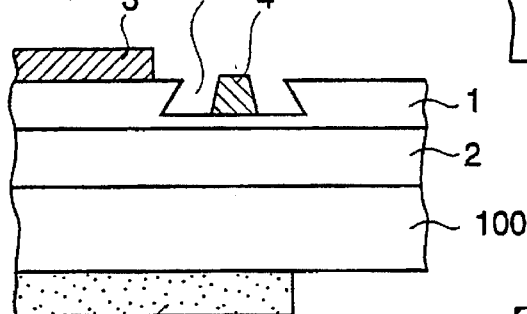
Figure 2:
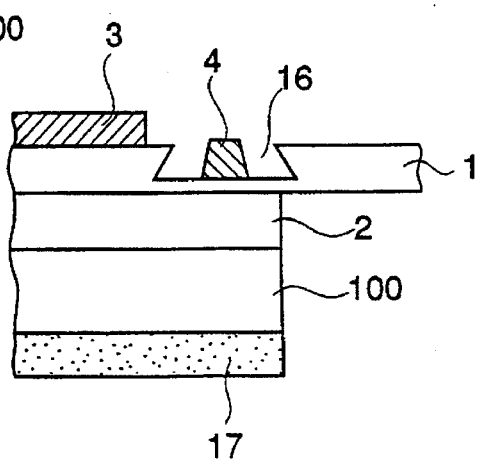

Next, the fabricating method is described with reference to FIGS. 2(a) to 2(f). First, as shown in FIG. 2(a), the buffer layer 2 and the active layer 1 are successively formed on the surface of the semiconductor substrate 100 by an epitaxial growth method. Next, as shown in FIG. 2(b), the source electrode 3 is formed on the surface of the active layer 1 by evaporation and lift-off.

Then, as shown in FIG. 2(c), the first resist 16 having an opening for producing the recess structure 15 next to the source electrode 3 is deposited so as to cover the source electrode 3 and the surface of the active layer 1. Then, using this first resist 16 as a mask, as shown in FIG. 2(d), the active layer 1 is etched to a depth of 1000 to 2000 Å using, for example, tartaric acid so that the recess structure 15 is formed. Furthermore, using the first resist 16 as a mask, the gate electrode 4 is formed by evaporation. Simultaneously with the production of the gate electrode 4, the layer 4a comprising the gate electrode material is formed on the first resist 16.

Then, the gate electrode material 4a on the first resist 16 is removed together with the first resist 16, and, as shown in FIG. 2(e), the second resist 17 having an opening under the region which is opposing to the source electrode 3 about the recess structure 15 is formed on the surface opposite to the front surface of the semiconductor substrate 100 (also referred to as the rear surface of the semiconductor substrate 100 hereinafter).

Furthermore, using the second resist 17 as a mask, the rear surface of the semiconductor substrate 100 is etched by RIE (reactive ion etching) until the rear surface of the active layer 1 is exposed using, for example, a mixture of He and Cl (FIG. 2(f)). Then, using the second resist 17 as a mask, the drain electrode 5 is formed on the rear surface of the active layer 1 by evaporation, and the second resist 17 is removed, thereby producing the FET shown in the FIG. 1.

Next, the operation is described. As shown in FIG. 1, this FET has the depletion region 6 under the gate electrode 4. This depletion region 6, as long as it remains in a region under the recess structure 15, grows horizontally mainly toward the drain electrode 5 when a negative voltage is applied to the gate electrode 4. The FET of the first embodiment has the drain electrode 5 on the rear surface of the active layer 1 which is opposite the surface on which the recess structure 15 is provided, as shown in FIG. 1. Therefore, even if the depletion region 6 grows out from under the recess region of the recess structure 15, the depletion region 6 does not spread along the side wall of the recess structure 15b like the prior art FET as shown in FIG. 8(b), but spreads toward the rear surface of the active layer 1 on which the drain electrode 5 is provided. Therefore, the ratio of the depletion region to the path which describes the shortest distance connecting the gate electrode 4 and the drain electrode 5 within the active layer 1 varies in response to the voltage applied to the gate electrode 4, and the gate-drain breakdown voltage does not decrease even though the distance d between the corner of the recess structure 15 and the edge of the gate electrode 4 is quite small, i.e., about 0.5 µm.

Furthermore, since in the first embodiment the recess structure 15 and the gate electrode 4 can be formed on the surface of the active layer 1, the widths of the recess structure 15 and the gate electrode 4 can be controlled with high precision and the gate electrode 4 can be formed in the recess structure 15 with high precision. Furthermore, since the width of the drain electrode 5 is several microns and it is very large compared to the widths of the gate electrode 4 and the recess structure 15, the mask pattern of the resist 17 that is used while etching the semiconductor substrate 100 or the buffer layer 2 is easily formed. Furthermore, since the accuracy of positioning of the drain electrode does not significantly influence transistor characteristics, even if the accuracy of positioning the drain electrode 5 during fabrication is deteriorated to some degree, approximately required transistor characteristics are obtained. Therefore, when compared to Japanese Published Utility Model Application No. Sho. 62-151769 in which the gate electrode was formed at the semiconductor substrate side of the active layer, it is easier to obtain an FET having the desired transistor characteristics.

As described above, according to the first embodiment of the invention, since the FET includes the recess structure 15 on the surface of the active layer 1, the gate electrode 4 disposed on the bottom of the recess structure 15, and the drain electrode 5 on the rear surface of the active layer 1 of the region next to the recess structure 15, even if the distance between the edge of the gate electrode and the corner of the recess structure is reduced, an FET having a high gate-drain breakdown voltage and desired characteristics with great repeatability can be provided.

Figure 3:
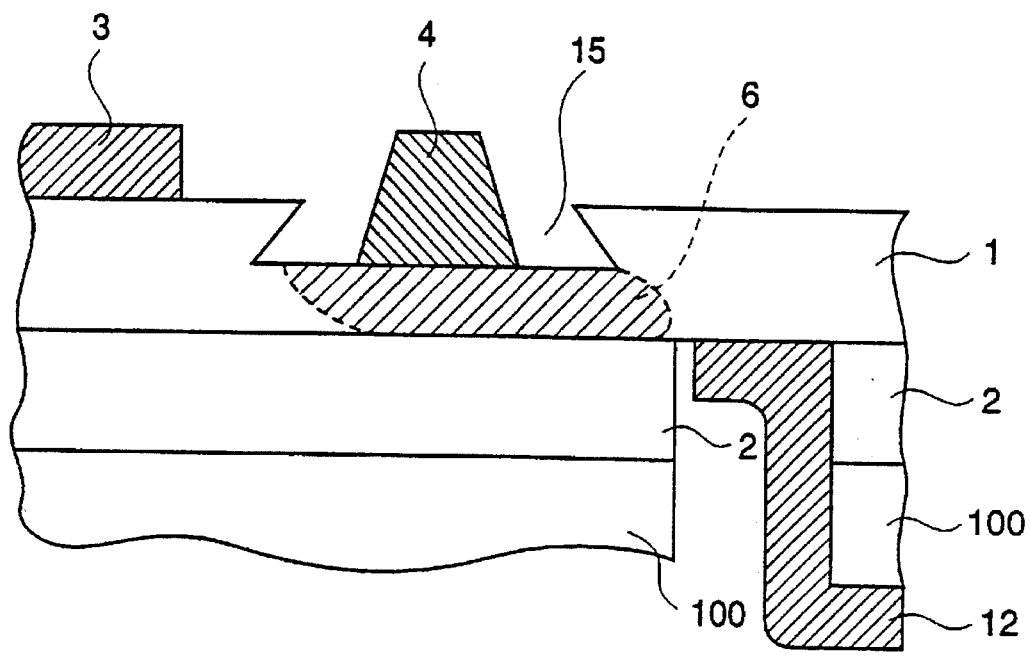
FIG. 3 is a cross-sectional view illustrating an FET according to a modification of the first embodiment of the present invention.

When it is required in the first embodiment to connect the drain electrode 5 with other circuit elements that are formed on the surface opposite to the front surface of the semiconductor substrate 100, the drain electrode 12 can be formed so that it is connected to these rear surface circuit elements (not shown in the figure) as shown in the FIG. 3. In FIG. 3, the same reference numerals used in FIG. 1 designate the same or corresponding parts. Reference numeral 12 designates the drain electrode which is connected to the rear surface circuit elements. In this case, the drain electrode and other circuit elements formed on the rear surface of the semiconductor substrate can easily be connected.

[EMBODIMENT 2]

Figure 4:
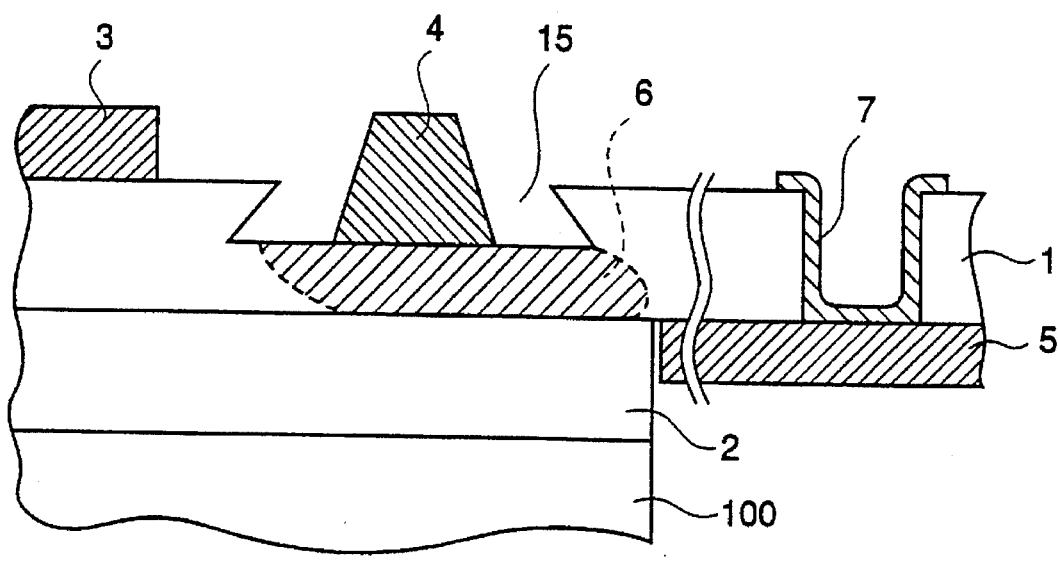
FIG. 4 is a cross-sectional view illustrating an FET according to a second embodiment of the present invention.

FIG. 4 is a cross-sectional view illustrating an FET according to a second embodiment of the present invention. In the figure, the same reference numerals used in FIG. 1 designate the same or corresponding parts. Reference numeral 7 designates a contact electrode.

The FET of this second embodiment is fabricated as follows, i.e., by a method similar to that used for the FET of the first embodiment. After producing the source electrode 3 and the gate electrode 4, a region of the active layer 1 where the drain electrode 5 is to be formed and adjacent the recess structure 15 is etched from the surface of the active layer 1 down to the interface with the buffer layer 2 using an etchant such as tartaric acid, thereby producing a through-hole. Then, a contact electrode 7 is formed by evaporation so as to cover the inner surface of the through-hole and, as in the first embodiment, the drain electrode 5 is formed on the rear surface of the active layer 1 for connection to the contact electrode 7.

Since in the first embodiment the drain electrode 5 is formed on the rear surface of the active layer 1, a decrease in the gate-drain breakdown voltage is prevented. However, since ordinary semiconductor devices have FETs or other circuit elements on a main surface of the same semiconductor substrate, it is required to connect the drain electrode 5 on the rear surface of the active layer 1 with the circuit elements on the front surface of the active layer 1.

However, since, in the second embodiment, the drain electrode 5 on the rear surface side of the active layer 1 is connected to the front surface of the active layer 1 via the contact layer 7, the decrease in the gate-drain breakdown voltage of the FET can be prevented as well as the connection of the FET with other circuit elements on the front surface of the semiconductor substrate 100 can be easily performed. However, the contact electrode 7 is preferably formed as far from the recess structure 15 as possible so that there is no influence on the growth direction of the depletion region 6.

The second embodiment described above exhibits similar effects as in the first embodiment. In addition, the connection of the FET to the other circuits on the front surface of the semiconductor substrate 100 can easily be realized.

Although in the second embodiment the etching method utilizing tartaric acid is used in producing the through-hole in the active layer 1, other etching methods can be used with similar effects being obtained.

Although in the second embodiment evaporation is used for forming the contact electrode 7, other methods can be used therefor with similar effects being obtained.

[EMBODIMENT 3]

Figure 5:
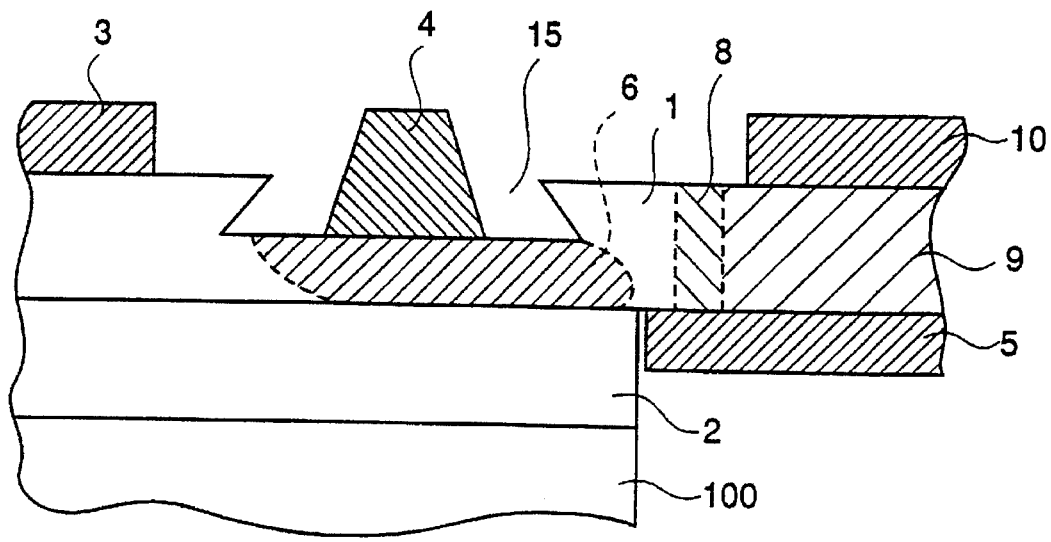
FIG. 5 is a cross-sectional view illustrating an FET according to a third embodiment of the present invention.

FIG. 5 is a cross-sectional view illustrating an FET according to a third embodiment of the present invention. In the figure, the same reference numerals used in FIG. 1 designate the same or corresponding parts. Reference numeral 8 designates an insulating region of high resistivity, reference numeral 9 designates a contact layer of low resistivity, and reference numeral 10 designates a surface drain electrode.

The FET of this third embodiment is fabricated as follows, similar to the method used for the FET of the first embodiment. After forming the source electrode 3, the recess structure 15 and the gate electrode 4, the insulating region 8 is formed in a portion of the active layer 1 in the region next to the recess structure 15 opposite to the source electrode 3 by introducing hydrogen (H) or boron (B) by ion implantation until the buffer layer 2 is reached. Then, the contact layer 9 is formed by introducing silicon (Si) or the like by ion implantation to a region of the active layer 1 adjacent to the insulating region 8 and opposite the recess structure 15 side, and the surface drain electrode 10 is formed on the contact layer 9 by evaporation and lift-off. Then, as in the first embodiment, the drain electrode 5 is formed on the rear surface of the active layer 1 so that it contacts the contact layer 9 and a region of the active layer 1 which is adjacent the insulating region 8 on the recess structure 15 side.

In the third embodiment, since, as in the first embodiment, the recess structure 15 is in the front surface of the active layer 1 and the drain electrode 5 is on the rear surface of the active layer 1, even if the distance between the edge of the gate electrode 4 and the corner of the recess structure 15 is reduced, a high gate-drain breakdown voltage can be maintained. Furthermore, since the drain electrode 5 is connected by the surface drain electrode 10 disposed on the surface of the active layer 1 through the contact layer 9, the connection to the other circuits on the front surface of the semiconductor substrate 100 can be easily realized as in the second embodiment.

Since there is the insulating region 8 between the recess structure 15 and the surface drain electrode 10, the growth of the depletion region 6 toward the surface drain electrode 10 on the surface of the active layer 1 can be prevented. Therefore, although in the second embodiment it is necessary to position the contact electrode 7 for taking the drain electrode 5 as far from the recess structure 15 as possible, it is possible to locate the surface drain electrode 10 close to the recess structure 15 in this third embodiment.

Since the FET of this third embodiment includes the active layer 1, the insulating region 8 which penetrates the active layer 1 from the front surface to the rear surface at one side of the recess structure 15 of the active layer 1, the contact layer 9 disposed in the region adjacent the insulating region 8 opposite the recess structure 15 side, the drain electrode 5 disposed on the rear surface of the active layer 1 in contact with the contact layer 9 and the region of the active layer 1 adjacent to the insulating region 8 on the recess structure 15 side, and the surface drain electrode 10 on the surface of the contact layer 9, this third embodiment has effects similar to those of the second embodiment. In addition, relative to the second embodiment, the electrode for connecting the drain electrode on the rear surface of the active layer to the front surface can be positioned close to the recess structure, whereby the area of the FET can be reduced.

Although in the above first, second, and third embodiments RIE is used for etching the semiconductor substrate 100 and the buffer layer 2 in forming the drain electrode 5, other methods that can produce a similar structure can be used.

[EMBODIMENT 4]

Figure 6:
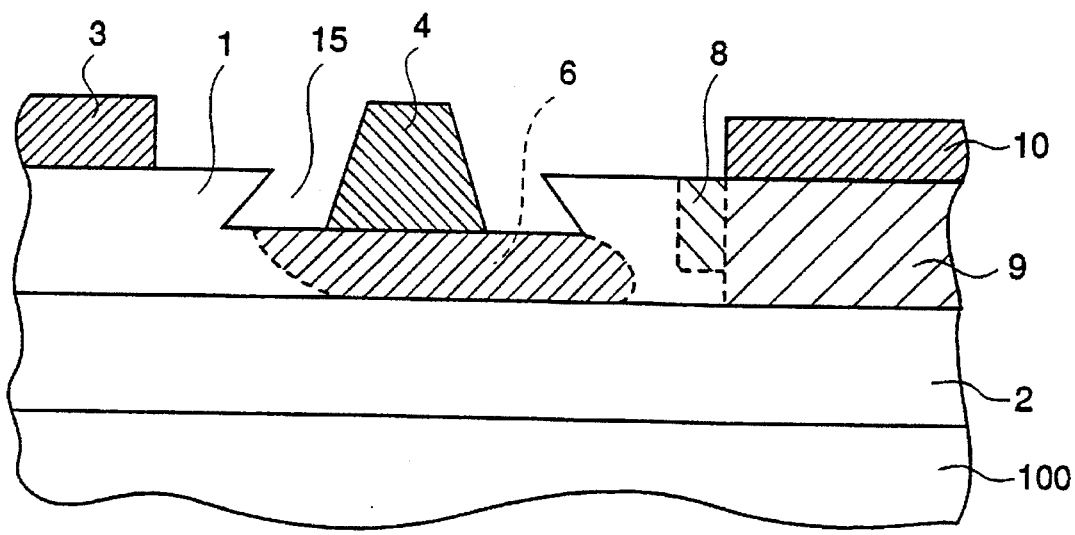
FIG. 6 is a cross-sectional view illustrating an FET according to a fourth embodiment of the present invention.

FIG. 6 is a cross-sectional view illustrating an FET according to a fourth embodiment of the present invention. In the figure, the same reference numerals used in FIG. 5 designate the same or corresponding parts.

The FET of the fourth embodiment is the same as the FET of the third embodiment except that the insulating region 8 does not reach the buffer layer 2 and the drain electrode 5 is not disposed on the rear surface of the active layer 1. The FET is fabricated by a method similar to that used for fabricating the FET of the third embodiment.

In the fourth embodiment, the surface drain electrode 10 is formed on the surface of the contact layer 9 of low resistivity, and the contact layer 9 and the recess structure 15 are separated by the insulating region 8. However, since the insulating region 8 does not reach the buffer layer 2 on the rear surface of the active layer 1 and, the contact layer 9 and the active layer 1 are connected with each other via a region under the insulating region 8, when a voltage is applied so that the gate electrode 4 becomes negative, the depletion region 6 grows toward the region between the insulating region 8 and the buffer layer 2. That is, since, as in the third embodiment the depletion region 6 grows toward the rear surface of the active layer 1, even if the distance between the edge of the gate electrode 4 and the corner of the recess structure 15 is reduced without locating the drain electrode on the rear surface of the active layer, a high gate-drain breakdown voltage can be maintained in this fourth embodiment. Therefore, it is not necessary to form the drain electrode or the gate electrode on the rear surface side of the active layer 1 as in the FET according to the third embodiment or the FET disclosed in Japanese Published Utility Model Application Sho. 62-151769, whereby the process for etching the semiconductor substrate and the buffer layer is not required. Therefore, the FET can be easily fabricated.

Furthermore, since as in the third embodiment the surface drain electrode 10 is disposed on the surface of the active layer 1 and is connected to the active layer 1 through the contact layer 9, the connection of the FET to other circuit elements on the front surface of the semiconductor substrate 100 can be easily performed in this fourth embodiment.

According to the fourth embodiment, the FET includes the insulating region 8 which is provided on one side of the active layer 1 relative to the recess structure 15 and extends from the front surface of the active layer to a prescribed depth not reaching the rear surface. The contact layer 9 which extends from the front surface to the rear surface of the active layer 1 and is disposed at a region adjacent the insulating region 8, which region is opposite the side of the recess structure 15, and the surface drain electrode 10 is on the contact layer 9 at the front surface side of the active layer 1, whereby similar effects as in the third embodiment are obtained. Furthermore, since the drain electrode and the gate electrode are not required to be the rear surface of the active layer, the fabrication process of the FET can be simplified.

[EMBODIMENT 5]

Figure 7:
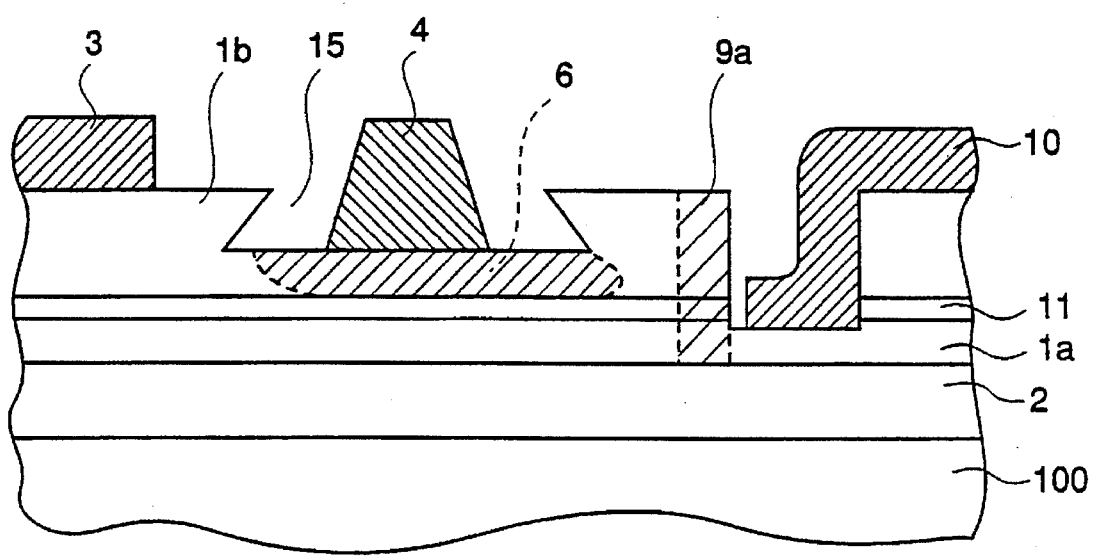
FIG. 7 is a cross-sectional view illustrating an FET according to a fifth embodiment of the present invention.
Figure 9A:
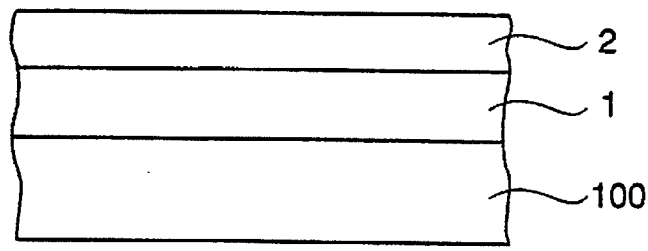
FIGS. 9(a) to 9(d) are cross-sectional process views illustrating a method of fabricating the prior art FET shown in FIGS. 8(a) and 8(b).
Figure 9B:
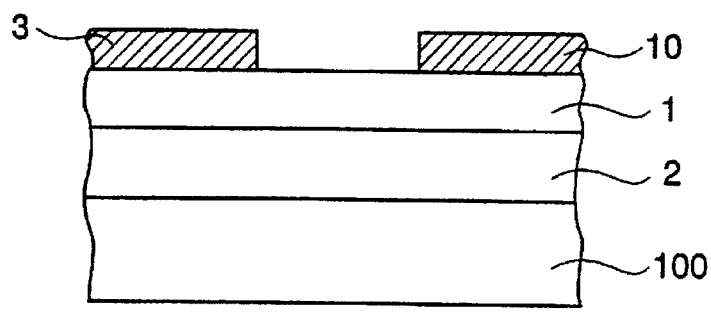
Figure 9C:
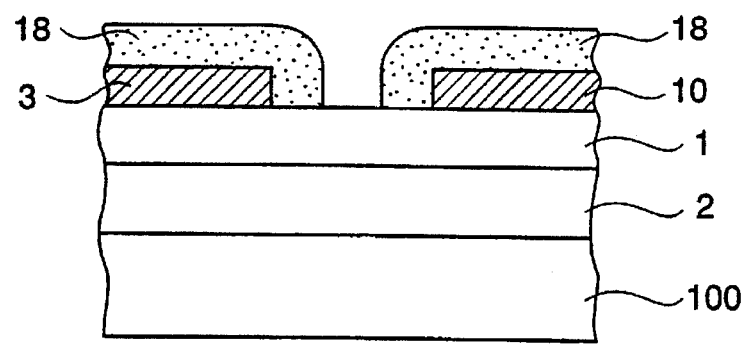
Figure 9D:
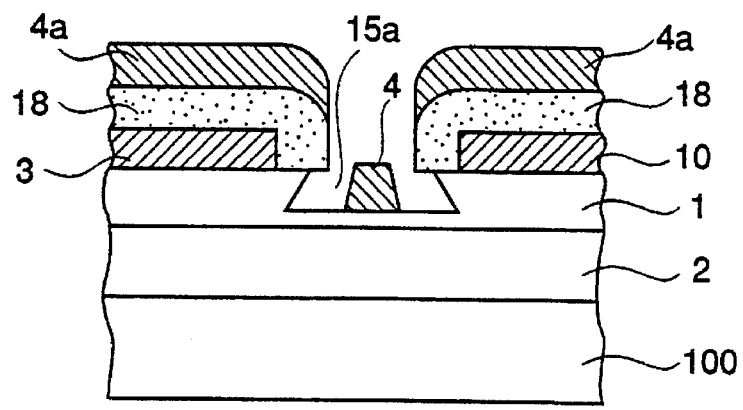
Figure 10:
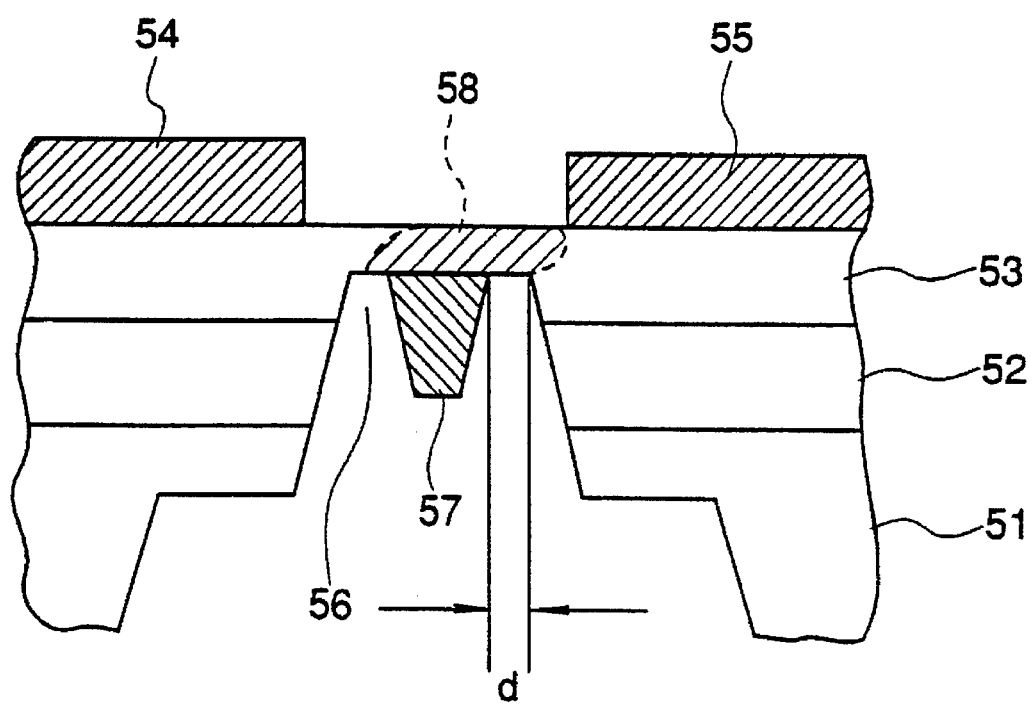
FIG. 10 is a cross-sectional view illustrating an FET according to the prior art.

FIG. 7 is a cross-sectional view illustrating an FET according to a fifth embodiment of the present invention. In the figure, the same reference numerals used in FIG. 6 designate the same or corresponding parts. Reference numeral 1a designates a first n type GaAs active layer, reference numeral 1b designates a second n type GaAs active layer, reference numeral 9a designates a contact layer, and reference numeral 11 designates a p type GaAs barrier layer. The active layer 1 of this fifth embodiment comprises a first active layer 1a and a second active layer 1b. The barrier layer 11 of this fifth embodiment is introduced so that the first active layer 1a is positioned on the rear surface of the second active layer 1b while keeping a thickness of the second active layer 1b under the bottom of the recess structure 15 that is required for obtaining desired transistor characteristics. In addition, by locating the drain electrode 10 on the surface of the first active layer 1a, the surface drain electrode 10 can be proximate the rear surface of the second active layer 1b. An npn junction includes the first active layer 1a, the barrier layer 11, and the second active layer 1b, the flow of current between the first active layer 1a and the second active layer 1b and the growth of the depletion region 6 toward the first active layer 1a are prevented.

Next, the fabricating method is described. As shown in FIG. 7, the buffer layer 2, the first active layer 1a, the barrier layer 11, and the second active layer 1b having a thickness of 1500 to 3000 Å are formed on the semiconductor substrate 100 using an MBE (Molecular Beam Epitaxy) apparatus or the like. Next, after forming the source electrode 3, the recess structure 15, and the gate electrode 4 on the surface of the second active layer 1b, the contact layer 9a having a depth reaching the buffer layer 2 is formed in the region next to the recess structure 15 by implanting Si at the surface of the active layer 1b by ion implantation. Then, the region adjacent the contact layer 9a, which is opposite the side of the recess structure 15 is etched until the first active layer 1a is exposed by RIE using a mixture of He and Cl. Then, the surface drain electrode 10 connected to circuits and the like on the second active layer 1b (not shown in the figure) is formed on the exposed surface of the first active layer 1a preferably by evaporation. Then, the contact layer 9a and the surface drain electrode 10 are not in direct contact with each other. The FET is obtained as described above.

In this fifth embodiment, the surface drain electrode 10 is connected to the second active layer 1b on which the recess structure 15 is located through the first active layer 1a exposed by etching and the contact layer 9a. When a voltage is applied so that the gate electrode 4 becomes negative, the depletion region 6 grows in the direction of the shortest distance between the gate electrode 4 and the drain electrode 10. Since the depletion region 6 thus grows toward the contact layer 9a at the barrier layer 11, the depletion region 6 does not circulate around the side of the recess structure 15, whereby a high gate-drain breakdown voltage can be maintained. Therefore, similar effects as in the fourth embodiment can be obtained in this fifth embodiment.

Although in the fifth embodiment the first active layer and the barrier layer are formed using MBE, the first active layer and the barrier layer can be formed by other methods with similar effects as in the above embodiments.

Furthermore, although in the fifth embodiment RIE is used as a method for etching the active layer 1 and the barrier layer 11 in forming the drain electrode, other methods which can form a similar structure can be used.

Furthermore, although in the above third, fourth, and fifth embodiments ion implantation is used as a method for forming the insulating region and the contact layer, other methods which can form insulating region and the contact layer can be used with the similar effects as in the above embodiments.

While in the above first, second, third, fourth, and fifth embodiments an etching method using tartaric acid is used for forming the recess structure on the surface of the active layer, any other method which can produce a similar recess shape can be used for forming the recess structure.

While in the above first, second, third, fourth, and fifth embodiments evaporation and lift-off are used for forming the source electrode, the gate electrode, and the drain electrode, any other method which can form the similar structure can be used.

While in the above first, second, third, fourth, and fifth embodiments, the conductivity type of the active layer is n type, this invention can be applied to cases in which the conductivity type of the active layer is p type with similar effects as in the above embodiments.

While in the above first, second, third, fourth, and fifth embodiments, GaAs and related materials are used as for the active layer, this invention can be applied to cases other materials with similar effects as in the embodiments described.

While in the above first, second, third, fourth, and fifth embodiments, an FET is described, this invention can be applied to other semiconductor devices with similar effects as in the above embodiments.

What is claimed is:

1. A semiconductor device comprising:

a semiconductor substrate having a first surface and a second surface opposing each other;

an active layer having a first surface and a second surface opposing each other and disposed on the first surface of the semiconductor substrate with the second surface of the active layer contacting the first surface of the semiconductor substrate;

a recess structure at the first surface of the active layer and having a bottom within the active layer;

a gate electrode disposed on the bottom of the recess structure;

a second surface drain electrode disposed on the second surface of the active layer adjacent the recess structure; and a source electrode disposed on the first surface of the active layer on the opposite side of the recess structure from the second surface drain electrode.

2. The semiconductor device as defined in claim 1 wherein said second surface drain electrode is connected to other circuit elements from the second surface of the semiconductor substrate.

3. The semiconductor device as defined in claim 1 including a contact electrode penetrating the active layer and connected to said second surface drain electrode.

4. The semiconductor device as defined in claim 1 including:

a contact region in the active layer having a lower resistivity than other regions of the active layer;

a first surface drain electrode disposed on the first surface of the active layer, said second surface drain electrode being connected to the first surface drain electrode by the contact region; and an insulating region disposed between the recess structure and the contact region and disposed in the active layer so that both the contact region and the first surface drain electrode are not directly electrically connected to the active layer proximate the recess structure, and the active layer proximate the recess structure is electrically connected to the second surface drain electrode through part of the active layer.

5. A semiconductor device comprising:

a semiconductor substrate having a first surface and a second surface opposing each other;

an active layer having a first surface and a second surface opposing each other and disposed on the first surface of the semiconductor substrate with the second surface of the active layer contacting the first surface of the semiconductor substrate;

a recess structure at the first surface of the active layer and having a bottom within the active layer;

a gate electrode disposed on the bottom of the recess structure;

a drain electrode disposed on the first surface of the active layer and not directly electrically connected to the active layer proximate the recess structure wherein the active layer includes (i) a contact region having a lower resistivity than other regions of the active layer, adjacent to the recess structure, and electrically connected to the drain electrode such that a depletion region generated in a region of the active layer in contact with the gate electrode grows toward the second surface of the active layer with increasing gate electrode voltage and (ii) an insulating region disposed between the contact region and the recessed structure; and a source electrode disposed on the first surface of the active layer on the opposite side of the recess structure from the drain electrode.

6. The semiconductor device as defined in claim 5 wherein the contact region extends from the first surface to the second surface of the active layer and the insulating region extends from the first surface of the active layer toward but not reaching the second surface of the active layer.

7. A semiconductor device comprising;

a semiconductor substrate having a first surface and a second surface opposing each other;

an active layer having a first conductivity type, a first surface and a second surface opposing each other, the active layer being disposed on the first surface of the semiconductor substrate with the second surface of the active layer contacting the first surface of the semiconductor substrate;

a recess structure at the first surface of the active layer and having a bottom within the active layer;

a gate electrode disposed on the bottom of the recess structure;

a drain electrode disposed on the first surface of the active layer and not directly electrically connected to the active layer proximate the recess structure wherein the active layer includes (i) a contact region having a lower resistivity than other regions of the active layer, adjacent to the recess structure, and electrically connected to the drain electrode such that a depletion region generated in a region of the active layer in contact with the gate electrode grows toward the second surface of the active layer with increasing gate electrode voltage and (ii) a barrier region having a second conductivity type opposite to the first conductivity type of the active layer and disposed within the active layer;

a source electrode disposed on the first surface of the active layer on the opposite side of the recess structure from the drain electrode; and a recess at the first surface of the active layer and having a bottom in the active layer deeper than the barrier region, the recess exposing part of the contact region on a side opposite the recess structure, the contact region extending from the first surface to the second surface of the active layer and the drain electrode being disposed on an inner surface of the recess without contacting the contact region.

8. The semiconductor device as defined in claim 5 wherein the insulating region extends from the first surface of the active layer to the second surface of the active layer.

9. The semiconductor device as defined in claim 8 wherein the insulating region extends from the first surface of the active layer to the second surface of the active layer including a second surface drain electrode disposed on the second surface of the active layer.

* * * * *